United States Patent [19]

Kermani et al.

[11] Patent Number: 5,324,684

[45] Date of Patent: Jun. 28, 1994

[54] GAS PHASE DOPING OF SEMICONDUCTOR MATERIAL IN A COLD-WALL RADIANTLY HEATED REACTOR UNDER REDUCED PRESSURE

[75] Inventors: Ahmad Kermani, Fremont; Kristian E. Johnsgard, San Jose; Carl Galewski, Berkeley, all of Calif.

[73] Assignee: AG Processing Technologies, Inc., Sunnyvale, Calif.

[21] Appl. No.: 843,361

[22] Filed: Feb. 25, 1992

[51] Int. Cl.$^5$ .............................................. H01L 21/20
[52] U.S. Cl. ........................................ 437/95; 437/166; 437/174; 437/141; 437/950; 437/165; 148/DIG. 30; 148/DIG. 35
[58] Field of Search ............... 118/620; 437/174, 95, 437/165, 166, 950, 141; 148/DIG. 35, DIG. 30, DIG. 144

[56] References Cited

U.S. PATENT DOCUMENTS

| | | |
|---|---|---|
| 3,524,776 | 8/1970 | Hampikian et al. . |
| 3,949,119 | 4/1976 | Shewchun et al. . |
| 4,108,106 | 8/1978 | Dozier . |
| 4,124,417 | 11/1978 | Sirot et al. . |
| 4,766,678 | 8/1988 | Yanase . |
| 4,939,103 | 7/1990 | Szolgyemy . |
| 4,951,601 | 8/1990 | Maydon et al. . |
| 5,156,820 | 10/1992 | Wong et al. . |

FOREIGN PATENT DOCUMENTS 63-239939 10/1988 Japan .

OTHER PUBLICATIONS

Sze, (ed.), "Diffusion"; *VLSI Technology;* 2d Ed.; Chapter 7, pp. 272-326; published by McGraw-Hill Publishing Co. (1988).
J. Electrochem. Soc 129(5) 1109-1116 (1982) by Baudrant et al.
Duffy et al; RCA Review 44, 313-325 (1983).

*Primary Examiner*—Olik Chaudhuri
*Assistant Examiner*—Ramamohan Rao Paladugu
*Attorney, Agent, or Firm*—Albert C. Smith

[57] ABSTRACT

A technique for doping silicon material or other semiconductors uses gas phase dopant sources under reduced pressure in a radiantly heated, cold-wall reactor. The technique is applied to the automated integrated circuit manufacturing techniques being adopted in modern fabrication facilities. The method includes placing a substrate comprising semiconductor material on a thermally isolated support structure in a reduced pressure, cold-wall reaction chamber; radiantly heating the substrate within the reaction chamber to a controlled temperature; flowing a gas phase source of dopant at controlled pressure and concentration in contact with the substrate so that the dopant is absorbed by the substrate, and annealing the substrate. The substrate may be first coated with a layer of polycrystalline semiconductor, and then gas phase doping as described above may be applied to the polycrystalline layer.

78 Claims, 4 Drawing Sheets

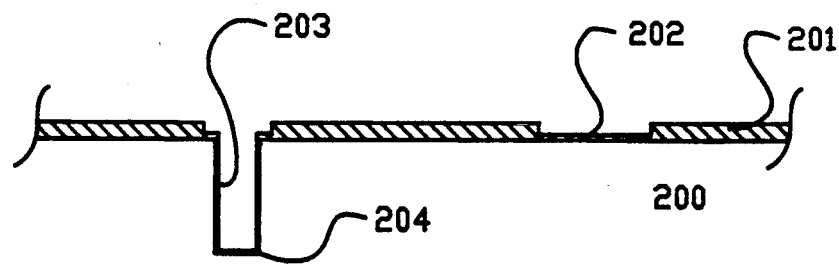
FIG.—3A
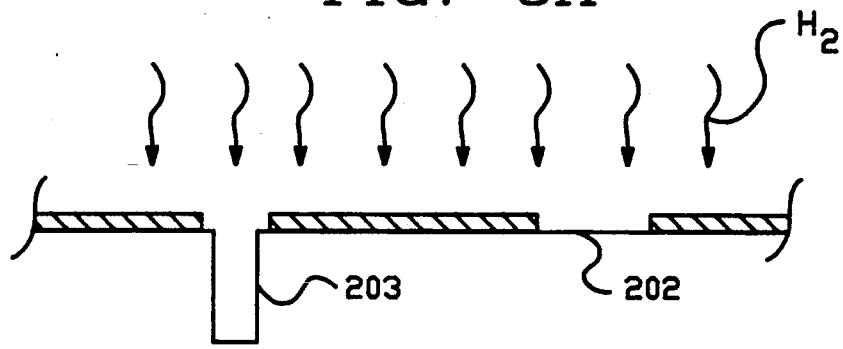
FIG.—3B
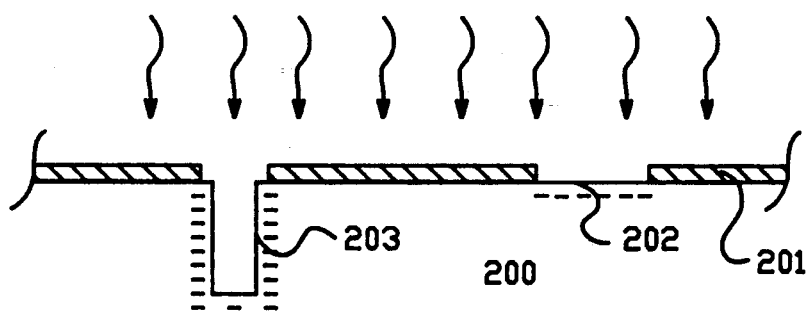
FIG.—3C
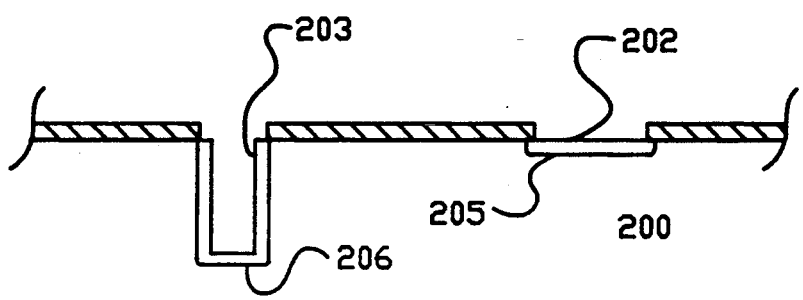
FIG.—3D

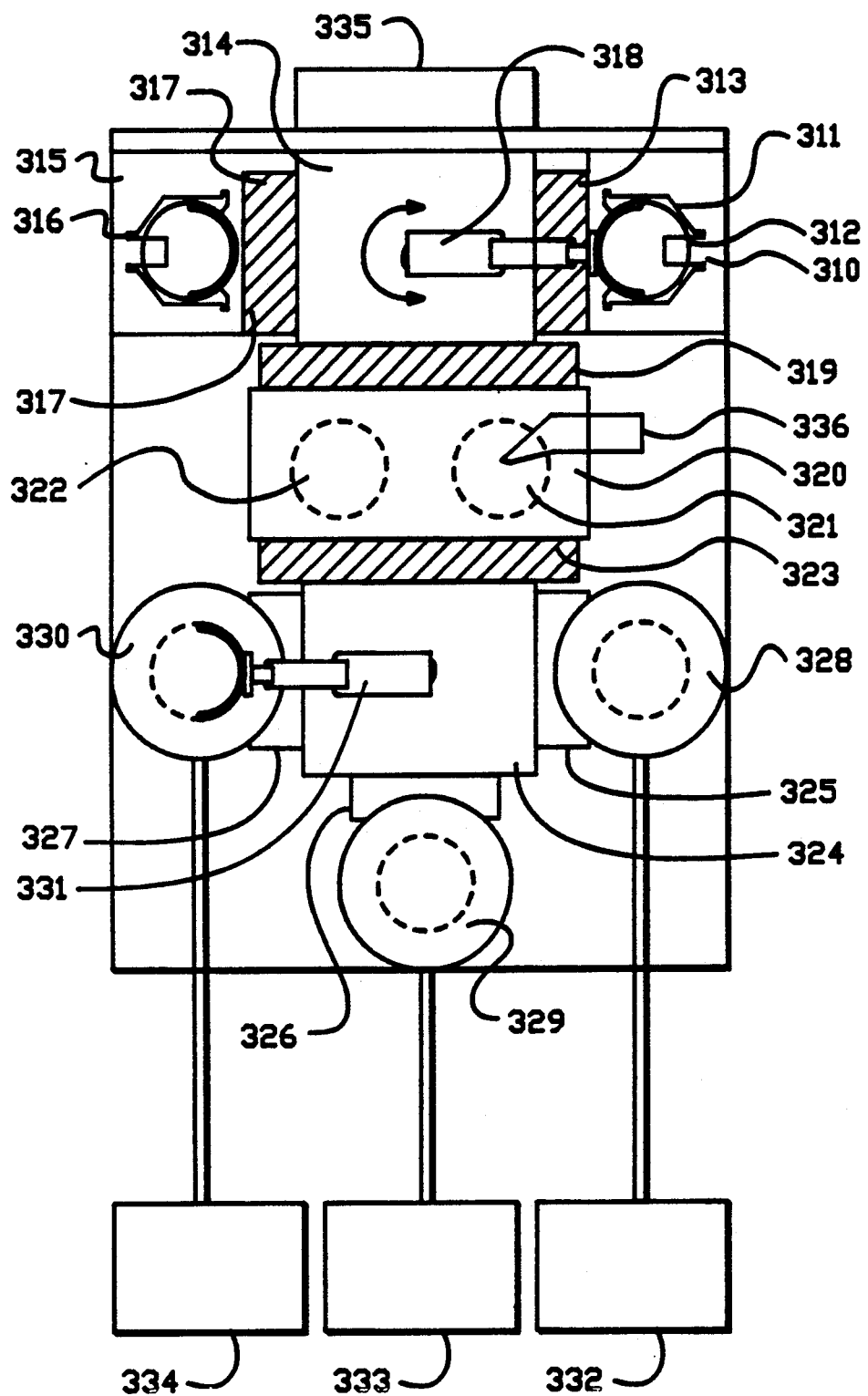
FIG.—4

GAS PHASE DOPING OF SEMICONDUCTOR MATERIAL IN A COLD-WALL RADIANTLY HEATED REACTOR UNDER REDUCED PRESSURE

FIELD OF THE INVENTION

The present invention relates to techniques for doping semiconductors used in the manufacture of integrated circuits, and more particularly to doping based on gas phase diffusion.

DESCRIPTION OF RELATED ART

Doping of semiconductor material by diffusion of impurity atoms into the semiconductor structure is an important technique in the fabrication of integrated circuits. Since the early 70s, the most important technique for supplying impurity atoms has been ion implantation, which involves accelerating ions into the semiconductor substrate at high energy. Ion implantation suffers disadvantages that it can cause significant defects in the semiconductor crystal, and that it is difficult to precisely control the depth at which atoms penetrate into the semiconductor structure.

As the dimensions of devices formed in integrated circuits shrink, the problem of controlling the depth of junctions formed in the semiconductor structure is becoming more important. Also, defects in the crystal caused by high energy ions have a greater impact on yield for very small devices.

After ions have been implanted in a semiconductor substrate using ion implantation, the ions are "activated" by annealing the semiconductor substrate with heat. This technique of heating the semiconductor substrate also has the effect of curing many defects that may have been caused by the implantation. However, it also suffers the added disadvantage that the heat induces some diffusion of the implanted ion so that the depth of junctions that are formed by ion implantation may be greater than desired for a given application.

Also, ion implantation suffers the disadvantage that for high aspect ratio structures on a semiconductor substrate, such as trenches, it is often difficult to insure that the stream of accelerated ions reaches all parts of the structure with controlled concentrations.

Another technique for forming junctions in semiconductor substrates involves diffusion of atoms into the substrate from the gas or vapor phase. Prior art gas phase diffusion techniques have involved batch furnaces, or other reaction chambers in which it is difficult to achieve precise control of the processing parameters for individual wafers, or which are not well suited for automated integrated circuit manufacturing within controlled environments. For a good description of the background of gas phase diffusion, see Sze (ed.), "Diffusion", VLSI TECHNOLOGY, 2d Ed., Chapter 7, pp. 272-326, published by McGraw-Hill Publishing Company (1988).

Accordingly, it is desirable to provide a technique for diffusing impurity atoms into semiconductor structures which allows for the creation of junctions of controlled shallow depths, which allows for greater control of diffusion into high aspect ratio structures on semiconductor substrates such as trenches, and which is well suited to automated integrated circuit manufacturing.

SUMMARY OF THE INVENTION

The present invention provides a technique for doping silicon material or other semiconductors, using reduced pressure gas phase dopant sources in a radiantly heated, cold-wall reactor. This technique can be used to dope single crystal and polycrystalline material to different levels of n and p-type doping concentrations. It also allows doping of materials having non-planar features, such as trenches, with good control, and the creation of very shallow junctions with low crystal damage and excellent predictability. Finally, the technique is well suited to the automated integrated circuit manufacturing techniques being adopted in modern fabrication facilities.

According to one aspect, the present invention can be characterized as a method for forming a doped semiconductor comprising:

(a) placing a substrate comprising semiconductor material in a radiantly heated, reduced pressure reaction chamber;

(b) radiantly heating the substrate within the reaction chamber to a controlled temperature;

(c) flowing a gas phase source of dopant at controlled pressure and concentration in contact with the substrate so that the dopant is absorbed by the substrate to a selected depth in the substrate; and (d) annealing the substrate to further diffuse the dopant in a controlled manner.

The gas flow path in the reaction chamber, according to another aspect of the invention, proceeds essentially perpendicular to the reaction surface of the substrate and flows in a single pass in a radially symmetric pattern off of the reaction surface.

In another aspect of the present invention, the process further includes cooling the walls of the reaction chamber, and supporting the substrate with a thermally inert support structure within the reaction chamber.

The substrate may be first coated with a layer of polycrystalline semiconductor, and then gas phase doping as described above may be applied to the polycrystalline layer.

According to yet another aspect of the present invention, a method for forming a doped semiconductor comprises:

(a) forming, in a first controlled pressure reaction chamber, a layer of polycrystalline semiconductor on a reaction surface of a substrate;

(b) transferring the substrate with the polycrystalline semiconductor layer, to a second controlled pressure reaction chamber without exposing the substrate to air;

(c) radiantly heating the layer on the reaction surface of substrate within the second reaction chamber to a controlled temperature;

(d) flowing, in the second reaction chamber, a gas phase source of dopant at controlled pressure and concentration in contact with the layer so that the dopant is absorbed in the layer to a selected depth in the layer; and (e) annealing the substrate to activate and further diffuse the dopant within in a controlled manner the layer of polycrystalline semiconductor.

Other aspects and advantages of the present invention can be seen upon review of the figures, the detailed description, and the claims which follow.

BRIEF DESCRIPTION OF THE FIGURES

FIGS. 3A–3D illustrate the process steps for doping a single crystal semiconductor material according to the present invention.

FIG. 4 is a schematic diagram of an automated integrated circuit fabrication line adapted for carrying out the process of FIGS. 2A–2D.

DESCRIPTION OF THE PREFERRED EMBODIMENTS

A detailed description of preferred embodiments of the present invention is provided with respect to FIGS. 1, 2A–2D, 3A–3D, and 4.

Figure 1:
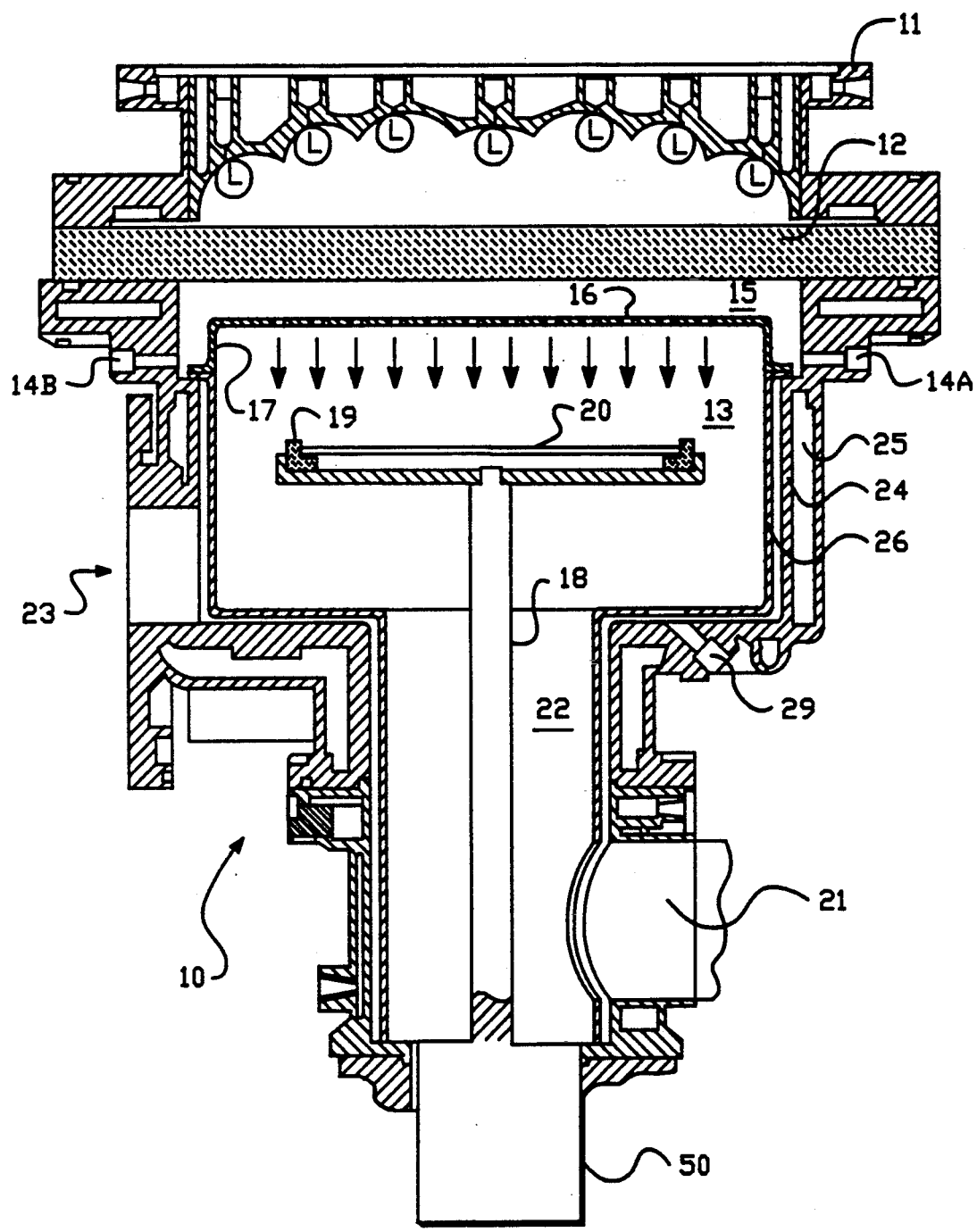
FIG. 1 is a cross-sectional diagram of a radiantly heated cold-wall reaction chamber for use according to the present invention.

In FIG. 1, a radiantly heated, cold-wall, reduced pressure reaction chamber, generally referred to by the reference number 10, is illustrated. Background concerning a chamber like that illustrated in FIG. 1, except applied to chemical vapor deposition and epitaxy processes, can be found in prior U. S. patent application entitled REACTION CHAMBER WITH CONTROLLED RADIANT ENERGY HEATING AND DISTRIBUTED REACTANT FLOW, Ser. No. 07/351,829, filed May 15, 1989 now U. S. Pat. No. 5,156,820.

The reaction chamber 10 includes a lamp housing 11 mounted over a quartz window 12 for supplying radiant energy into a reaction region 13 of the reaction chamber 10. Reaction gases are supplied through nozzles 14A, 14B, into a plenum region 15, and through perforations (e.g., 16) in a shower head 17 and into the reaction region 13. Within the reaction region, a support member, including a shaft 18 and a wafer seat 19, supports and thermally isolates a substrate 20 within the reaction region. The reaction surface of the substrate 20 faces the shower head 17 and the source of radiant energy (lamp housing 11).

The reaction chamber 10 has a neck region 22, which has a reduced diameter relative to the reaction region 13. The reaction chamber is coupled in the neck region 22 through port 21 to a vacuum pump not shown. The reaction gases thus flow along a path which strikes the reaction surface of the substrate 20 substantially perpendicular to the surface and proceeds essentially radially symmetrically off of the substrate 20 and through the neck region 22 out the port 21. This accomplishes essentially a single, uniform pass of the reaction gases over the reaction surface of the substrate 20.

A gate at port 23 is operated to allow movement of the substrate 20 into and out of the reaction chamber.

The support member 18 is coupled to a mechanism 50 for rotating and translating the substrate 20 within the reaction region 13 in the manner described in co-pending U.S. patent application referred to above, or, alternatively, in the manner described in co-pending U.S. patent application entitled ROTARY/LINEAR ACTUATOR FOR CLOSED CHAMBER, AND REACTION CHAMBER UTILIZING SAME, Ser. No. 07/602,750, filed Oct. 24, 1990 now U.S. Pat. No. 5,148,714.

The walls 24 of the reaction chamber include passages 25 for the flow of coolant to cool the walls of the reaction chamber. Also, a pyrometer 29 is mounted in the wall of the reaction chamber near the reaction region 13 for the purposes of monitoring the temperature and other characteristics of the substrate 20. A port (not shown) for a thermocouple sensor is added in a preferred system. Also ports (not shown) are provided for hydrogen purging between liner 26 and the walls 24 of the reaction chamber.

One gas phase diffusion process according to the present invention, is illustrated in FIGS. 2A–2D, which show a reaction surface of a substrate supported in a reaction chamber as illustrated in FIG. 1.

Figure 2A:
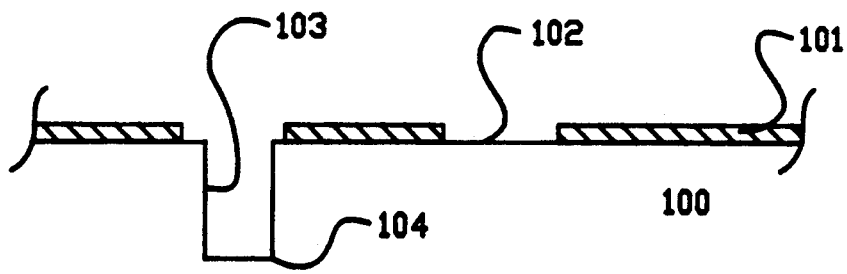
FIGS. 2A–2D illustrate the process steps for forming and doping a polycrystalline silicon layer on a silicon substrate according to the present invention.

In the first step, as shown in FIG. 2A, an oxide masking step is accomplished using any one of a variety of integrated circuit manufacturing techniques known in the art. After the oxide masking step, as illustrated in FIG. 2A, the substrate 100 will have a pattern of oxide 101 formed on the reaction surface. The pattern of oxide 101 will leave exposed contact regions 102 and 103 in the silicon substrate 100. The silicon substrate 100 may include non-planar and high-aspect ratio features, such as trench 104. The feature may have very small dimensions. For instance, a trench 104 may be 0.25–1 microns across and 3–8 microns deep. Such trenches may or may not have vertical walls, and may take on a variety of configurations known in the art. Also, the substrate may have other non-planar features, of which the trench is an example. Other examples include EPROM device tunnelling structures, and other high and low aspect ratio structures.

Figure 2B:
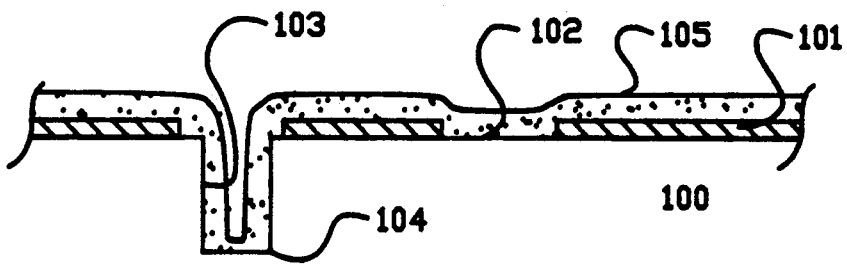

FIG. 2B illustrates the second step according to this aspect of the present invention. In the second step, a layer of polycrystalline silicon 105 is deposited on the substrate 100 over the oxide layers 101, and the contact regions 102, and 103 within the trench 104.

The polycrystalline deposition according to one example, is carried out using rapid thermal chemical vapor deposition, RTCVD, in a reaction chamber such as that illustrated in FIG. 1. The polycrystalline deposition may be carried out at a 2.0 Torr pressure using silane chemistry in the cold-wall chamber of FIG. 1. The thickness of the polycrystalline film may be controlled as known in the art. After polycrystalline silicon deposition, the silicon source gas is turned off.

Figure 2C:
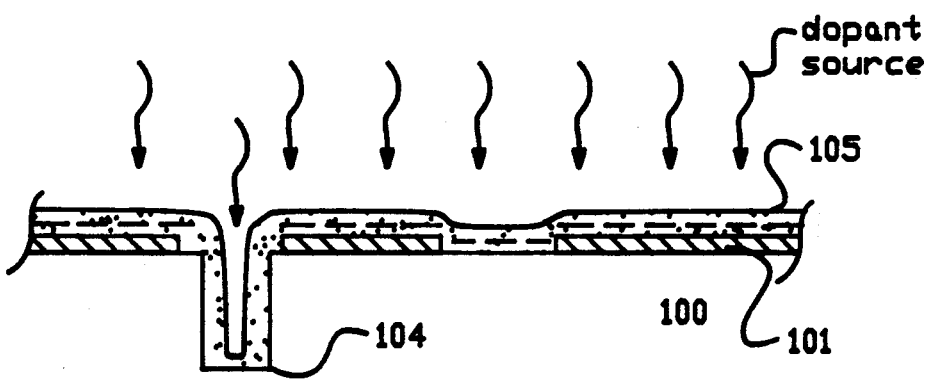

The next step of the reaction is illustrated in FIG. 2C. Within the same reaction chamber, after turning off the silicon source gas, the dopant gas may be introduced to dope the polycrystalline layer 105 as indicated by dashes in the figure. According to one example, the doping temperature at the reaction surface is controlled using the radiant heat source at 1,000° C. A gas flow of a di-borane (boron hydride) dopant source with a concentration of 1,000 ppm in hydrogen is then introduced at a gas flow rate of 95 standard cubic centimeters per minute (sccm), metered through a mass flow controller, such as that provided by Metering Unit Instruments, San Jose, Calif. The doping temperature was maintained at 1,000° C. for a time of 60 seconds during the dopant source flow with process pressure controlled at 20 Torr. The dopant gas flow is then shut off. Finally, the doped polysilicon film is in-situ annealed at 1,000° C. for 30 seconds. The post-doping anneal activates the dopant to lower the film sheet resistance. Improved doping rates may be achieved by replacing or diluting the hydrogen carrier with an inert gas, such as argon, to increase the rate of dissociation of the dopant hydride into dopant ions and hydrogen.

As illustrated in FIG. 2C, the dopant source in a reaction chamber as illustrated in FIG. 1, impacts the reaction surface of the substrate 100 in a substantially perpendicular gas flow path. Also, because the dopant is in the gas phase, it penetrates the trench 104 with uniform and predictable characteristics.

Other doping materials may be used. For silicon substrates or polycrystalline silicon, the doping material may be other materials from Group III or Group V, such as phosphorus, arsenic, antimony, or others. Smaller doping atoms are believed to diffuse more readily than larger ones. Dopant hydrides such as phosphine ($PH_3$) and arsine ($A_sH_3$) are appropriate materials for gas phase doping with hydrogen and/or inert gas carriers.

Figure 2D:
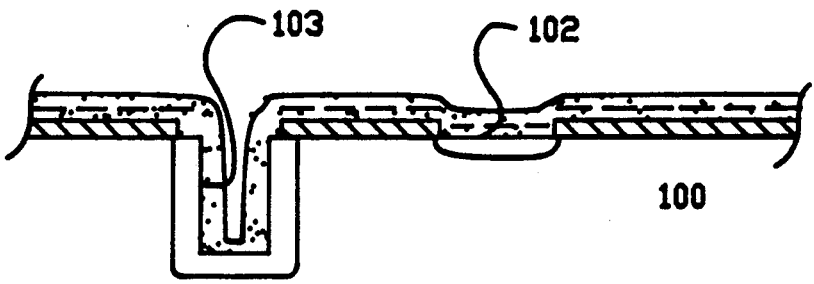

As illustrated in FIG. 2D, a further process step may be carried out when it is desirable to make shallow junctions in the substrate 100 in the contact regions 102, 103. According to this embodiment, a subsequent diffusion step relies on the doped polycrystalline silicon as the diffusion source for the substrate crystal structure. The diffusion is accomplished by an additional thermal drive in step. This thermal drive in may be controlled to create junctions of controlled depth and concentration as known in the art.

In one example, a polycrystalline silicon film was formed on a silicon wafer in the single wafer, water cooled, lamp heated reactor of FIG. 1. The polycrystalline deposition was laid down over a flat wafer with uniform thickness. After the gas phase doping process using di-borane with a hydrogen carrier, as described above with respect to FIGS. 2A–2D, the resulting film was analyzed for sheet resistance, using the four point probe technique. A layer having a thickness of approximately 1650 angstroms was formed having a sheet resistance of 164.4 Ohms per square cm, with a standard deviation of 4.045% or a total electrically active concentration of about $4 \times 10^{19}$ $cm^{-3}$. Secondary ion mass spectrometry (SIMS) of the same indicates a total concentration (activated and not activated) of about $1.5 \times 10^{20}$ $cm^{-3}$. These measurements illustrate good process control within the reaction chamber.

In yet another example, phosphine ($PH_3$) in a carrier comprising a mixture of hydrogen and argon was used to dope a polycrystalline layer. In this second example, a 1000 sccm flow rate of 1000 ppm phosphene in hydrogen was mixed with a 6000 sccm flow rate of argon. This resulted in a layer having a thickness of approximately 3322 angstroms having a sheet resistance of approximately 436 Ohms per square cm with a 4.076% standard deviation, or a total electrically active concentration of about $2 \times 10^{18}$ $cm^{-3}$.

Higher concentrations of dopant hydride in a carrier of inert gas, such as pure argon, will result in faster deposition rates. A carrier having a reduced concentration of hydrogen is particularly useful for dopant hydrides in which the dissociation of the dopant ion from hydrogen is enhanced in an atmosphere with reduced excess hydrogen, such as is achieved with an inert gas carrier.

It is important for gas phase diffusion that the polycrystalline layer 105 have very little oxide on the surface. Thus, the polycrystalline layer 105 must not be exposed to ambient atmosphere between the deposition and dopant steps of FIGS. 2B and 2C. Alternatively, if the polycrystalline layer 105 is exposed to the ambient, it should be cleaned so that the concentration of oxide is less than about $2 \times 10^{14}$ $cm^{-2}$ total interfacial oxygen dose. One preferred technique for accomplishing the oxygen cleaning step is a hydrogen clean process in which the water is heated to 800° C. or greater and preferably at least 900° C., in a hydrogen ambient for one to ten minutes. The hydrogen reduces the silicon dioxide to clean the exposed silicon regions on the substrate.

Other chemistries may be used for the cleaning of native oxides from substrates, such as HF vapor, or others.

FIGS. 3A–3D illustrate an alternative technique according to the present invention for doping a single crystal substrate within a reaction chamber like that illustrated in FIG. 1. According to the method of FIGS. 3A–3D, a first step involves oxide masking. In the oxide masking step, a layer of oxide 101 is formed over a substrate 100. The oxide will include contact regions 202, and 203, where contact region 203 may be within a trench 204. In FIG. 3A, the oxide layer 201 is exaggerated within the contact regions 202, 203 for the purpose of emphasizing that a very thin layer of oxide may be left after the oxide masking step of FIG. 3A or may otherwise be formed.

Thus, the next step illustrated in FIG. 3B involves cleaning of the contact regions 202, 203 of oxide using a hydrogen clean step as described above.

In the next step, as illustrated in FIG. 3C, a gas phase doping of the contact region illustrated by the dashes around the contact regions 202, 203 is carried out such as described above with respect to FIG. 2C. Because the oxide mask layer 201 will block the dopant from reaching the substrate underneath the oxide layer 201, it provides an effective masking technique. Further, the dopants will not be absorbed well by the oxide, and the oxide will not behave as a dopant source in subsequent processing steps.

Finally, as illustrated in FIG. 3D, a thermal drive in or anneal step may be used to activate and/or further diffuse the dopants in the doped regions in the substrate 200. Thus, a junction 205 of controlled depth and a junction 206 of controlled depth are formed in the contact regions 202, 203. The depth of these diffusion contact regions may be very carefully controlled using gas phase doping in the cold-wall, radiantly heated reaction chamber according to the present invention.

FIG. 4 illustrates an automated wafer processing system adapted for processing methods according to the present invention, such as the method described with respect to FIGS. 2A–2D. The system includes a first cassette dock 310 for staging a cassette 311 of semiconductor wafers 312 into the system. Alternatively, the dock 310 may be adapted for single wafers, SMIF compartments, or for other process substrates. The cassette dock 310 is coupled at gate 313 with a first robotic transfer chamber 314. The gate may or may not include a valve for isolating the cassette dock 310 from the transfer chamber 314. In the preferred system, the cassette dock includes an elevator inside a loadlock. The system includes a second cassette dock 315 for staging wafers in a cassette 316 through a gate 317 which is coupled to the first robotic transfer chamber 314. The first robotic transfer chamber 314 includes a robotic arm 318 for transporting wafers through the valve gates 313 and 317, and through a third gate 319 into a staging chamber 320.

The staging chamber 320 includes a plurality of stations for staging wafers into the process modules. In particular, a pre-process station 321 and a post-process station 322 are provided for supporting wafers in the staging chamber 320. The staging chamber 320 is coupled to a gate 323 of a second robotic transfer chamber 324. The second robotic transfer chamber is a controlled atmosphere chamber having a plurality of valve gates 325, 326, 327 which are coupled to process chambers 328, 329, 330. A robotic arm 331 in the second robotic transfer chamber 324 transfers wafers from the pre-process station into individual process chambers 328, 329, 330, and out of the process chambers 328, 329, 330, into the post-process station 322 of the staging chamber 320, while preventing exposure of the wafer to ambient conditions. The robotic arm 318 in the first robotic transfer chamber 314 then completes the transportation of the wafer from the staging chamber 320 into a cassette in a cassette dock 310 or 315.

Coupled to each of the process chambers 328, 329, 330, is a process support module 332, 333, 334 which is particularly adapted to support a given process in a respective process chamber.

A control console 335 made up of a programmable computer, is coupled to the robotic arms 318, 331, the gates 313, 317, 319, 323, 325, 326, 327, the pre- and post-process stations 321, 322, the cassette docks 310, 315, a variety of sensors not shown here, and to the process support modules 332, 333, 334, and controls the transportation of single wafers through the system under program control.

The staging chamber 320 having a plurality of staging stations facilitates the transportation of wafers into the process chambers while avoiding gridlock between ingoing and outgoing wafers.

In addition, a mechanism 336 comprising monitoring, preparation and/or finishing apparatus is coupled with the staging chamber 320. The mechanism 336 is schematically illustrated in FIG. 1, but may comprise any of a variety of systems for monitoring a characteristic of a wafer, preparing the wafer or finishing a process of the wafer sitting in one of the plurality of stations 321, 322 of the staging chamber 320. For instance, the apparatus 336 could be a system for detecting cleanliness of the wafer, a system for reading an identifying marker on the wafer for inventory processes, an eyepiece for visual inspection of the wafer, or other characteristic monitoring apparatus known in the art. Examples of "preparation" steps that could be done by mechanism 336 include preparing the wafer to a designated location or orientation, and conditioning or cleaning of the surface of the wafer. Examples of "post" or "finishing" processes include measuring the result of process, and heating or cooling of the substrate. For a mechanism 336 that generates a monitor or process status signal, the mechanism 336 is coupled to the control console 335 providing input to the transportation control system.

As illustrated in FIG. 4, the process chamber 328 is configured for deposition of polycrystalline layers. Process chamber 329 is adapted for the gas phase doping. Process chamber 330 may be adapted for other integrated circuit processing steps as needed for a given production line. Thus, the method according to the present invention, comprises forming in the first chamber 328 a layer of polycrystalline semiconductor on the wafer. Next, the wafer is transferred with the polycrystalline layer to the second controlled pressure reaction chamber 329 without exposing the substrate to the ambient atmosphere, and within a controlled atmosphere transfer chamber 324. Techniques for establishing a controlled atmosphere in transfer region 324 include evacuating the region to very low pressure, and/or purging the region with ultrapure inert gases so that it is essentially oxygen free. Next, the second reaction chamber is used for gas phase doping, involving flowing a gas phase source of dopant at controlled pressure and concentration in contact with the polycrystalline layer, so that the dopant is absorbed in the layer. Finally, either within the chamber 329 or in other chambers, such as chamber 330, the substrate may be annealed, or further processing steps carried out.

The multi-chamber integrated processing system illustrated in FIG. 4 allows carrying out the poly deposition in a reaction chamber different from the chamber used for gas phase doping. This prevents any contamination of the reaction chamber that may occur due to poly deposition from affecting the doping steps. Also, it allows transfer between reaction chambers without exposing the surface of the wafer to be doped to air which may cause formation of a native oxide and retard the dopant diffusion.

The technique according to the present invention has numerous applications in the fabrication of integrated circuits using polycrystalline or single crystal silicon doping. Polycrystalline silicon is a fundamental material for MOS gate electrode fabrication, and capacitor electrode fabrication (planar, elevated, trench, or sandwiched). Also, polycrystalline silicon is used for poly-emitter contact material for bipolar and biCMOS devices. Polycrystalline silicon is used as contact material for a variety of devices. It can be used as a diffusion source as mentioned above, as interconnect material, as resistors, and for many other purposes.

The present invention also has application for doping of a single crystal silicon in the formation of shallow junctions with no crystalline defects. Compared to ion implantation, for example, the problems associated with channeling and crystal damage due to the high energy ions used in ion implantation can be totally eliminated. Also, the technique of gas phase doping may be used in a variety of environments where implantation is not easily used, such as for deep trenches, shallow structures, or other high aspect ratio morphology configurations. Since the dopant source is in the gas phase, the dopant efficiency is only limited by gas phase diffusion physics.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method for forming doped semiconductor, comprising:

placing a substrate comprising semiconductor material in a radiantly heated, reduced pressure reaction chamber;

radiantly heating the substrate within the reaction chamber to a controlled temperature;

flowing a gas phase source of dopant at controlled pressure and concentration in contact with the substrate so that the dopant is absorbed by the substrate to a selected depth in the substrate; and annealing the substrate to further diffuse the dopant in a controlled manner.

2. The method of claim 1, wherein the semiconductor material comprises silicon.

3. The method of claim 2, wherein the source of dopant comprises a Group III or Group V element.

4. The method of claim 1, wherein the source of dopant comprises a dopant hydride with a carrier comprising hydrogen.

5. The method of claim 1, wherein the source of dopant comprises a dopant hydride with a carrier comprising an inert gas.

6. The method of claim 1, wherein the source of dopant comprises a dopant hydride with a carrier comprising a mixture of hydrogen and an inert gas.

7. The method of claim 1, wherein substrate has a reaction surface and the step of flowing a gas phase source of dopant includes:

establishing a gas flow path in the reaction chamber, the gas flow path proceeding essentially perpendicular to the reaction surface of the substrate.

8. The method of claim 1, wherein substrate has a reaction surface and the step of flowing a gas phase source of dopant includes:

establishing a gas flow path in the reaction chamber, the gas flow path proceeding essentially perpendicular to the reaction surface of the substrate, and radially symmetrically off of the reaction surface.

9. The method of claim 1, wherein substrate has a reaction surface facing a source of radiant energy and the step of flowing a gas phase source of dopant includes:

supplying the source of dopant to the reaction chamber between the source of radiant energy and the reaction surface;

pumping the source of dopant from the reaction chamber at a position establishing a single pass of the source of dopant over the reaction surface.

10. The method of claim 9, wherein the single pass proceeds essentially perpendicular to the reaction surface and radially symmetrically off of the reaction surface.

11. The method of claim 1, wherein the reaction chamber has walls, and further including:

cooling the walls of the reaction chamber.

12. The method of claim 1, wherein the step of placing the substrate within a reaction chamber includes:

supporting the substrate with a thermally inert support structure.

13. The method of claim 1, further including prior to the step of flowing a source of dopant:

cleaning oxide from the substrate so that regions to be doped have a concentration of oxide at reaction surfaces of less than $2 \times 10^{14}/cm^2$.

14. A method for forming doped semiconductor, comprising:

forming a layer of polycrystalline semiconductor on a reaction surface of a substrate;

radiantly heating the layer on the reaction surface of the substrate within a reaction chamber to a controlled temperature;

flowing a gas phase source of dopant at controlled pressure and concentration in contact with the layer so that the dopant is absorbed in the layer to a selected depth in the layer; and annealing the substrate to activate and further diffuse the dopant in a controlled manner within the layer of polycrystalline semiconductor.

15. The method of claim 14, further including a second step of annealing the substrate to drive dopant into the substrate from the layer of polycrystalline semiconductor.

16. The method of claim 14, wherein the polycrystalline semiconductor comprises silicon.

17. The method of claim 16, wherein the source of dopant comprises a Group III or Group V element.

18. The method of claim 14, wherein the source of dopant comprises a dopant hydride with a carrier comprising hydrogen.

19. The method of claim 14, wherein the source of dopant comprises a dopant hydride with a carrier comprising an inert gas.

20. The method of claim 14, wherein the source of dopant comprises a dopant hydride with a carrier comprising a mixture of hydrogen and an inert gas.

21. The method of claim 14, wherein the step of flowing a gas phase source of dopant includes:

establishing a gas flow path in the reaction chamber, the gas flow path proceeding essentially perpendicular to the reaction surface of the substrate.

22. The method of claim 14, wherein the step of flowing a gas phase source of dopant includes:

establishing a gas flow path in the reaction chamber, the gas flow path proceeding essentially perpendicular to the reaction surface of the substrate, and radially symmetrically off of the reaction surface.

23. The method of claim 14, further including:

supporting the substrate within the reaction chamber so that the reaction surface faces a source of radiant energy; and the step of flowing a gas phase source of dopant includes:

supplying the source of dopant to the reaction chamber between the source of radiant energy and the reaction surface;

pumping the source of dopant from the reaction chamber at a position establishing a single pass of the source of dopant over the reaction surface.

24. The method of claim 23, wherein the single pass proceeds essentially perpendicular to the reaction surface and radially symmetrically off of the reaction surface.

25. The method of claim 14, wherein the reaction chamber has walls, and further including:

cooling the walls of the reaction chamber.

26. The method of claim 14, further including:

supporting the substrate with a thermally inert support structure in the reaction chamber during the steps of heating and flowing.

27. The method of claim 14, further including prior to the step of flowing a source of dopant:

cleaning oxide from the polycrystalline semiconductor so that regions to be doped have a concentration of oxide of less than $2 \times 10^{14}/cm^2$.

28. A method for forming doped semiconductor, comprising:

forming, in a first controlled pressure reaction chamber, a layer of polycrystalline semiconductor on a reaction surface of a substrate;

transferring the substrate with the polycrystalline semiconductor layer, to a second controlled pressure reaction chamber without exposing the substrate to air;

radiantly heating the layer on the reaction surface of substrate within the second reaction chamber to a controlled temperature;

flowing, in the second reaction chamber, a gas phase source of dopant at controlled pressure and concentration in contact with the layer so that the dopant is absorbed in the layer to a selected depth in the layer; and annealing the substrate to activate and further diffuse the dopant in a controlled manner within the layer of polycrystalline semiconductor.

29. The method of claim 28, further including a second step of annealing the substrate to drive dopant into the substrate from the layer of polycrystalline semiconductor.

30. The method of claim 28, wherein the polycrystalline semiconductor comprises silicon.

31. The method of claim 30, wherein the source of dopant comprises a Group III or Group V element.

32. The method of claim 28, wherein the source of dopant comprises a dopant hydride with a carrier comprising hydrogen.

33. The method of claim 28, wherein the source of dopant comprises a dopant hydride with a carrier comprising an inert gas.

34. The method of claim 28, wherein the source of dopant comprises a dopant hydride with a carrier comprising a mixture of hydrogen and an inert gas.

35. The method of claim 28, wherein the step of flowing a gas phase source of dopant includes:

establishing a gas flow path in the second reaction chamber, the gas flow path proceeding essentially perpendicular to the reaction surface of the substrate.

36. The method of claim 28, wherein the step of flowing a gas phase source of dopant includes:

establishing a gas flow path in the second reaction chamber, the gas flow path proceeding essentially perpendicular to the reaction surface of the substrate, and radially symmetrically off of the reaction surface.

37. The method of claim 28, further including:

supporting the substrate within the second reaction chamber so that the reaction surface faces a source of radiant energy; and the step of flowing a gas phase source of dopant includes:

supplying the source of dopant to the second reaction chamber between the source of radiant energy and the reaction surface;

pumping the source of dopant from the second reaction chamber at a position establishing a single pass of the source of dopant over the reaction surface.

38. The method of claim 37, wherein the single pass proceeds essentially perpendicular to the reaction surface and radially symmetrically off of the reaction surface.

39. The method of claim 28, wherein the second reaction chamber has walls, and further including:

cooling the walls of the second reaction chamber.

40. The method of claim 28, further including:

supporting the substrate with a thermally inert support structure in the second reaction chamber during the steps of heating and flowing.

41. The method of claim 28, wherein the step of transferring comprises:

robotically transporting the substrate from the first reaction chamber to the second reaction chamber through a controlled atmosphere transfer region.

42. A method for forming doped semiconductor, comprising:

placing a substrate comprising a semiconductor material in a radiantly heated, controlled pressure reaction chamber;

masking the substrate to form a pattern on the substrate, the pattern exposing a contact region on the substrate;

heating the substrate within the reaction chamber to a controlled temperature;

flowing a gas source of dopant at a controlled pressure and concentration in contact with the substrate and the contact region so that the dopant is absorbed by the substrate and the contact region to a desired depth in the substrate and in the contact region; and annealing the substrate to further diffuse the dopant to a controlled concentration and depth.

43. The method according to claim 42, wherein the substrate comprises a nonplanar feature and the contact region is located within the nonplanar region.

44. The method according to claim 43, wherein the nonplanar feature comprises a trench.

45. The method of claim 42, wherein the substrate comprises silicon.

46. The method according to claim 45, wherein the source of dopant comprises a Group III or Group V element.

47. The method according to claim 42, wherein the source of dopant comprises a dopant hydride with a carrier comprising hydrogen.

48. The method according to claim 42, wherein the source of dopant comprises a dopant hydride with a carrier comprising an inert gas.

49. The method according to claim 42, wherein the dopant comprises a dopant hydride with a carrier comprising a mixture of hydrogen and an inert gas.

50. The method according to claim 42, wherein the substrate has a reaction surface and the step of flowing a gas phase source of dopant includes:

establishing a gas flow path in the reaction chamber, the gas flow proceeding essentially perpendicular to the reaction surface of the substrate.

51. The method according to claim 42, wherein the substrate has a reaction surface and the step of flowing a gas phase source of dopant includes:

establishing a gas flow path in the reaction chamber, the gas flow path proceeding essentially perpendicularly to the reaction surface of the substrate and radially symmetric off of the reaction substrate.

52. The method according to claim 42, wherein the substrate has a reaction surface facing a source of radiant energy and the step of flowing a gas phase source of dopant includes:

supplying the source of dopant to the reaction chamber between the source of radiant energy and the reaction surface; and pumping the source of dopant from the reaction chamber at a position establishing a single pass of dopant over the reaction surface.

53. The method according to claim 52, wherein the single pass proceeds essentially perpendicular to the reaction surface and radially symmetric off of the reaction surface.

54. The method according to claim 42, wherein the reaction chamber has walls and further including:
cooling the walls of the reaction chamber.

55. The method according to claim 42, wherein the step of placing the substrate within a reaction chamber includes:
supporting the substrate with a thermally inert support structure.

56. The method according to claim 42, further comprising prior to the step of flowing a gas phase source of dopant:
cleaning oxide from the substrate so that regions to be doped have a concentration of oxide less than $2 \times 10^{14}/cm^2$.

57. The method according to claim 42, further including a second step of annealing the substrate to drive the dopant into the substrate from the contact region.

58. The method according to claim 42, wherein the substrate comprises a polycrystalline semiconductor.

59. The method according to claim 58, wherein the polycrystalline semiconductor comprises silicon.

60. The method according to claim 1, wherein the substrate comprises a nonplanar feature and a contact region, the contact region being located within the nonplanar feature.

61. The method according to claim 60, wherein the nonplanar feature comprises a trench.

62. The method according to claim 14, wherein the substrate comprises a nonplanar feature and a contact region, the contact region being located within the nonplanar feature.

63. The method according to claim 62, wherein the nonplanar feature comprises a trench.

64. The method according to claim 28, wherein the substrate comprises a nonplanar feature and a contact region, the contact region being located within the nonplanar feature.

65. The method according to claim 64, wherein the nonplanar feature comprises a trench.

66. The method according to claim 1, wherein the heating is carried out at about 1000° C. for about 1 minute.

67. The method according to claim 66, wherein the annealing is carried out at about 1000° C. for about 30 seconds.

68. The method according to claim 14, wherein the heating is carried out at about 1000° C. for about 1 minute.

69. The method according to claim 68, wherein the annealing is carried out at about 1000° C. for about 30 seconds.

70. The method according to claim 28, wherein the heating is carried out at about 1000° C. for about 1 minute.

71. The method according to claim 70, wherein the annealing is carried out at about 1000° C. for about 30 seconds.

72. The method according to claim 42, wherein the heating is carried out at about 1000° C. for about 1 minute.

73. The method according to claim 70, wherein the annealing is carried out at about 1000° C. for about 30 seconds.

74. A method for fabricating shallow junctions for contact regions for integrated circuit devices, comprising:
forming a layer of polycrystalline semiconductor on a surface of a substrate;
placing the substrate in a radiantly heated, reduced pressure reaction chamber;
radiantly heating the substrate within the reaction chamber to a first controlled temperature;
flowing for a controlled time a gas phase source of dopant at a controlled pressure and concentration in contact with the polycrystalline semiconductor so that dopant is absorbed by the polycrystalline semiconductor;
annealing at a second controlled temperature to diffuse the dopant in a controlled manner into the polycrystalline semiconductor; and
annealing further under conditions such that the dopant in the polycrystalline semiconductor diffuses in a controlled manner into the substrate to create junctions having a controlled shallow depth and controlled dopant concentration.

75. A method according to claim 74, wherein the polycrystalline semiconductor comprises silicon.

76. A method according to claim 74, wherein the first controlled temperature is about 1000° C.

77. A method according to claim 74, wherein the second controlled temperature is about 1000° C.

78. A method according to claim 77, wherein the second controlled temperature is held for about 30 seconds.

* * * * *